(12) United States Patent
  Zuo et al.

(10) Patent No.: US 12,561,601 B2
(45) Date of Patent: Feb. 24, 2026

(54) INTELLIGENT SENSOR SYSTEM ARCHITECTURE AND REALIZATION METHOD AND APPARATUS THEREFOR

(71) Applicant: ANHUI YUNTA ELECTRONIC TECHNOLOGIES CO., LTD., Ningguo (CN)

(72) Inventors: Chengjie Zuo, Ningguo (CN); Jun He, Ningguo (CN)

(73) Assignee: ANHUI YUNTA ELECTRONIC TECHNOLOGIES CO., LTD., Ningguo (CN)

( * ) Notice: Subject to any disclaimer, the term of this patent is extended or adjusted under 35 U.S.C. 154(b) by 1417 days.

(21) Appl. No.: 16/965,779

(22) PCT Filed: May 22, 2018

(86) PCT No.: PCT/CN2018/087887
  § 371 (c)(1),
  (2) Date: Jul. 29, 2020

(87) PCT Pub. No.: WO2019/144540
  PCT Pub. Date: Aug. 1, 2019

(65) Prior Publication Data
  US 2021/0027200 A1     Jan. 28, 2021

(30) Foreign Application Priority Data

Jan. 29, 2018   (CN) ......................... 201810082922.X
  Jan. 29, 2018   (CN) ......................... 201820145041.3

(51) Int. Cl.
  G06N 20/00        (2019.01)
  H01L 25/065       (2023.01)
       (Continued)

(52) U.S. Cl.
  CPC ......... G06N 20/00 (2019.01); H01L 25/0655 (2013.01); H01L 25/0657 (2013.01);
       (Continued)

(58) Field of Classification Search
  CPC ........ G06N 20/00; G06N 3/04; G06N 3/0464; G06N 3/0475; G06N 3/0495;
       (Continued)

(56) References Cited

U.S. PATENT DOCUMENTS

2008/0270066 A1* 10/2008 Blaser .................... G01D 21/02
                                                        702/127
2014/0192629 A1*  7/2014 Zahrt .................... G11B 13/04
                                                        369/13.32
       (Continued)

FOREIGN PATENT DOCUMENTS

CN        101927781 A      12/2010
CN        105716651 A       6/2016
       (Continued)

OTHER PUBLICATIONS

Office Action and translation (JP 2020-541542), dated Aug. 19, 2021.
       (Continued)

*Primary Examiner* — Lawrence C Tynes, Jr.
(74) *Attorney, Agent, or Firm* — HUNTON ANDREWS KURTH LLP

(57)            ABSTRACT

Provided are an intelligent sensor system architecture and an implementation method and apparatus therefor. The system architecture includes a sensor module and an artificial intelligence processing module, where the sensor module and the artificial intelligence processing module are connected to each other in a monolithic integration manner or a modular integration manner; the sensor module is configured to acquire a measurement signal and convert the measurement (Continued)

110

120

Sensor module — Monolithic integration / Modular integration — Artificial intelligence processing module signal into an electrical signal; and the artificial intelligence processing module is configured to execute a corresponding artificial intelligence processing operation according to the electrical signal generated by the sensor module.

13 Claims, 6 Drawing Sheets

(51) Int. Cl.

| | | |
|---|---|---|
| *H04N 5/232* | (2006.01) | |
| *H04N 5/3745* | (2011.01) | |
| *H04N 23/60* | (2023.01) | |

(52) U.S. Cl.
CPC ..... *H04N 23/64* (2023.01); *H01L 2225/0651* (2013.01); *H01L 2225/06572* (2013.01)

(58) Field of Classification Search
CPC ........ G06N 3/0499; G06N 3/02; G06N 5/043; G06F 15/78; H01L 25/0655; H01L 2225/0651; H01L 2225/06572

See application file for complete search history.

(56) References Cited

U.S. PATENT DOCUMENTS

| | | | | |
|---|---|---|---|---|
| 2017/0018688 A1* | 1/2017 | Mazed | .................. | G09G 3/035 |
| 2017/0054895 A1* | 2/2017 | Wan | .................... | H04N 23/672 |
| 2017/0083063 A1* | 3/2017 | Saeidi | ....................... | G01K 7/22 |
| 2017/0192089 A1* | 7/2017 | Parker | .................. | G08G 5/0026 |
| 2019/0066255 A1* | 2/2019 | Nalluri | ..................... | G06T 1/20 |

FOREIGN PATENT DOCUMENTS

| | | | |
|---|---|---|---|
| CN | 107179130 A | 9/2017 |
| CN | 108052934 A | 5/2018 |
| JP | 03-113562 A | 5/1991 |
| JP | 2004119955 A | 4/2004 |
| JP | 2006032561 A | 2/2006 |
| JP | 2006128196 A | 5/2006 |
| JP | 2008053286 A | 3/2008 |
| JP | 2008252790 A | 10/2008 |
| WO | 2017031205 A1 | 2/2017 |

OTHER PUBLICATIONS

First Search Report (CN201810082922.X).
PCT Search Report (PCT/CN2018/087887), dated Nov. 2, 2018.
First Office Action (CN201810082922.X)—machine translation.

* cited by examiner

INTELLIGENT SENSOR SYSTEM ARCHITECTURE AND REALIZATION METHOD AND APPARATUS THEREFOR

CROSS-REFERENCE TO RELATED APPLICATIONS

This is a National Stage Application, filed under 35 U.S.C. 371, of International Patent Application No. PCT/CN2018/087887, filed on May 22, 2018, which claims priority to Chinese patent applications No. 201810082922.X and No. 201820145041.3 filed on Jan. 29, 2018, contents of all of which are incorporated herein by reference in their entireties.

TECHNICAL FIELD

Embodiments of the application relate to the technical field of sensor and artificial intelligence, for example, to an intelligent sensor system architecture and an implementation method and apparatus thereof.

BACKGROUND

With the progress of technology, artificial intelligence, as a subject in rapid development, has been widely used in digital signal processing of image, sound and the like. The combination of artificial intelligence and sensor technology will enhance intelligence level of sensors and will be an important development direction for artificial intelligence.

In the related art, the artificial intelligence and the sensor technology are combined in the following manner: a system architecture of an intelligent device includes a sensor and a system on chip (SoC) for implementing an artificial intelligence function, the sensor is connected to the SoC through a data line, and the sensor transmits a sensing signal to the SoC through the data line for virtualized intelligence determination or parsing, such as face recognition, scene recognition and semantic recognition.

However, as the application range of artificial intelligence expands, the system architecture will become a bottleneck for the development of artificial intelligence, which is reflected in three aspects described below.

(1) With the increasing amount of data transmitted from the sensor to the SoC in unit time, transmission via data line causes a limited transmission bandwidth and a low transmission rate. Although a sensor bridge is used for increasing the transmission rate, room for improvement is limited, and rather delay will be increased.

(2) Due to a large delay of a process of performing artificial intelligent processing on the sensing signal of the sensor, the system architecture is not suitable for the application fields sensitive to the delay, such as automatic/auxiliary driving, and has a small application range.

(3) Signal distortion occurs in digitization of the sensing signal, and the lost information may cause adverse effects on subsequent artificial intelligence operations.

SUMMARY

Embodiments of the present application provide an intelligent sensor system architecture, an implementation method and apparatus thereof.

In a first aspect, the embodiments of the present application provide an intelligent sensor system architecture, which includes a sensor module and an artificial intelligence processing module.

The sensor module and the artificial intelligence processing module are connected to each other in a monolithic integration manner or a modular integration manner;

the sensor module is configured to acquire a measurement signal and convert the measurement signal into an electrical signal; and the artificial intelligence processing module is configured to execute a corresponding artificial intelligence processing operation according to the electrical signal generated by the sensor module.

In a second aspect, the embodiments of the present application provide a method for implementing an intelligent sensor system architecture, which includes steps described below.

An artificial intelligence processing module acquires an electrical signal generated by a sensor module connected to the artificial intelligence processing module in a monolithic integration manner or a modular integration manner; and the artificial intelligence processing module executes a corresponding artificial intelligence processing operation according to the electrical signal.

In a third aspect, the embodiments of the present application provide an apparatus for implementing an intelligent sensor system architecture, which includes an acquisition unit and an artificial intelligence processing unit.

The acquisition unit is configured in an artificial intelligence processing module and is configured to acquire an electrical signal generated by a sensor module connected to the artificial intelligence processing module in a monolithic integration manner or a modular integration manner; and the artificial intelligence processing unit is configured in the artificial intelligence processing module and is configured to perform a corresponding artificial intelligence processing operation according to the electrical signal.

The present application further provides a computer-readable storage medium configured to store computer-executable instructions for executing any one method for implementing an intelligent sensor system architecture described above.

The present application further provides an intelligent sensor device. The device includes one or more processors, memory, and one or more programs stored in the memory, where when executed by the one or more processors, the one or more programs execute any one method for implement the intelligent sensor system architecture described above.

The present application further provides a computer program product including a computer program stored on a non-transient computer-readable storage medium, where the computer program includes program instructions that, when executed by a computer, enable the computer to execute any one method for implement the intelligent sensor system architecture described above.

DETAILED DESCRIPTION

The present application will be further described in detail with reference to the accompanying drawings and embodiments. It is to be understood that the embodiments set forth below are intended to illustrate and not to limit the present application. It is to be noted that to facilitate description, only part, not all, of structures related to the present application are illustrated in the accompanying drawings.

Figure 1:
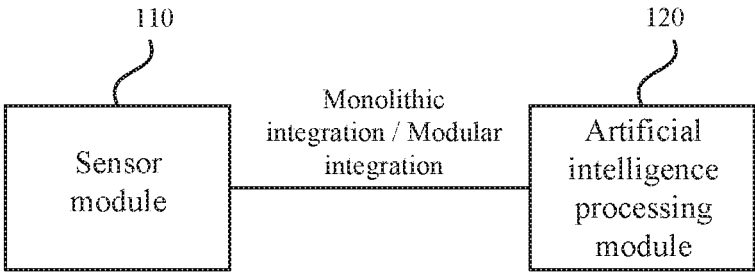
FIG. 1 is a structural diagram of an intelligent sensor system architecture in an embodiment.

FIG. 1 is a structural diagram of an intelligent sensor system architecture in an embodiment, the embodiment is applicable to a case of acquiring the sensing signal and executing the artificial intelligent operation through the system architecture of the intelligent sensor, and the system may be implemented in a software and/or hardware manner and is generally integrated in a smart terminal device, such as a mobile phone, a tablet computer.

The system in the embodiment of the application includes a sensor module 110 and an artificial intelligence processing module 120.

The sensor module 110 and the artificial intelligence processing module 120 are connected to each other in a monolithic integration manner or a modular integration manner.

The sensor module and the artificial intelligence processing module may be integrated in one chip, or a chip in which the sensor module is configured and a chip in which the artificial intelligence processing module is configured are modularly integrated. In an embodiment, when the sensor module and the artificial intelligence processing module are monolithically integrated, data may be transmitted between the sensor module and the artificial intelligence processing module through a metal wire on the chip. When the sensor module and the artificial intelligence processing module are modularly integrated, data may be transmitted between the chip in which the sensor module is configured and the chip in which the artificial intelligence processing module is configured through a metal wire on a connecting plate. The inventor finds that, compared with the data transmission manner through a data line in the related art, the transmission rate is high and the transmission delay is small when data is transmitted between the sensor module and the artificial intelligence processing module integrated on a same chip through the metal wire or between the sensor module and the artificial intelligence processing module disposed on different chips through the metal line on the connecting plate.

The sensor module 110 is configured to acquire a measurement signal and convert the measurement signal into an electrical signal.

In an embodiment, the sensor module may include at least one sensing unit and may further include a functional circuit for signal processing or signal control. The at least one sensing unit in the sensor module may be used for collecting different types of measurement signals, for example, a light signal, a voice signal, a temperature signal, a pressure signal and the like, and accordingly, the sensor module may be used for image sensing, sound sensing, temperature sensing, pressure sensing and the like. Based on different application scenarios, the sensor module can acquire a corresponding type of measurement signal according to actual application requirements, and the sensor module can also acquire at least one type of measurement signal at the same time. The embodiments of the present application do not limit to the types and a number of the types of measurement signals acquired by the sensor module.

The artificial intelligence processing module 120 is configured to execute a corresponding artificial intelligence processing operation according to the electrical signal generated by the sensor module 110.

In an embodiment, the artificial intelligence processing module may be divided into at least one functional unit, and each functional unit can perform a corresponding artificial intelligence operation. The artificial intelligence operation may include face recognition, iris recognition, natural language processing, language recognition and the like. The artificial intelligence processing module may perform at least one artificial intelligence operation according to the electrical signal generated or output by the sensor module. In an embodiment, the artificial intelligence processing module may include an artificial intelligence processor or a digital signal processor. The artificial intelligence processor may perform a corresponding artificial intelligence processing operation according to pre-stored artificial intelligence processing instructions, or may perform a corresponding artificial intelligence processing operation according to artificial intelligence processing instructions sent by a central processor or an application processor. A combination manner of the artificial intelligence processing module and the sensor module may be set according to the actual application conditions. Exemplarily, in an application condition sensitive to delay, for example, automatically braking after identifying someone in front of the vehicle in an automatic driving environment, the artificial intelligence processor in the artificial intelligence processing module can form an integrated circuit with a part of the functional circuits in the sensor module, while implementing a sensor module function, the artificial intelligence processing operation is performed to save delay. In an application condition that does not require other digital signal processing, the artificial intelligence processor in the artificial intelligence processing module can form an integrated circuit with the analog-to-digital conversion circuit in the sensor module to perform the artificial intelligence processing operation and implement an analog-to-digital conversion function to reduce the extra delay caused by the digital signal processing circuit. In an application conditions non-sensitive to delay or errors, the artificial intelligence processor in the artificial intelligence processing module can connect to the sensor module through the digital signal processor, and then perform the artificial intelligence processing operation after performing relevant digital signal processing operations.

In this embodiment, taking that the sensor module is used in the technical field of safety driving assist as an example, sensor modules for acquiring different types of measurement signals may be installed on a vehicle. Exemplarily, the sensor modules may include an infrared sensing unit, photoelectric sensing unit, microwave radar ranging sensing unit, laser radar ranging sensing unit and the like, to acquire information such as vehicles, roads, and vehicle surroundings, assist a driver to increase environmental awareness in conjunction with the artificial intelligence processing module and provide a warning signal.

An intelligent sensor system architecture provided by the embodiment of the present application can break through the traditional connection manner of connecting a sensor module and an artificial intelligence processing module through a data line, and optimize the design of the system architecture to reduce a transmission distance between the sensor module and artificial intelligence processing module, thereby effectively improving the data transmission rate, reduces delay of data transmission, quickly performing artificial intelligence operations on the signals acquired by the sensor module, improving the artificial intelligence degree, and having a wide application range.

Figure 2A:
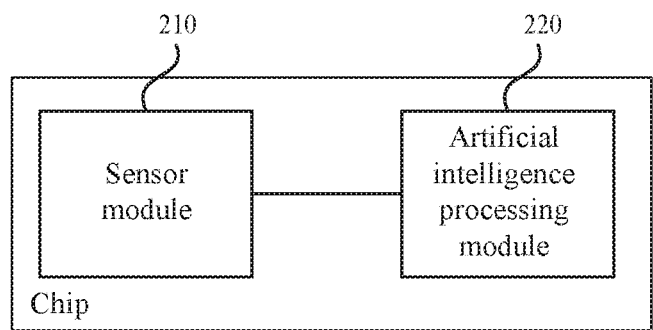
FIG. 2A is a structural diagram of an intelligent sensor monolithic integration manner in an embodiment.

This application further provides an embodiment that is optimized based on the above-mentioned embodiment, and further optimizes the intelligent sensor system architecture. FIG. 2A is a structural diagram of an intelligent sensor monolithic integration manner in an embodiment. Referring to FIG. 2A, this embodiment includes a sensor module 210 and an artificial intelligence processing module 220.

The sensor module 210 and the artificial intelligence processing module 220 are connected to each other in a monolithic integration manner or a modular integration manner.

In an embodiment, the monolithic integration manner includes steps described below. The sensor module and the artificial intelligence processing module are integrated in a same chip, the sensor module and the artificial intelligence processing module are connected to each other through a metal wire in the chip, and the metal wire is located in at least one metal layer.

The sensor module and the artificial intelligence processing module are integrated in the same chip and connected through metal wires in the chip. The metal wires can be located in a same metal layer or different metal layers, which is not limited in the embodiment of the present application.

The sensor module 210 and the artificial intelligence processing module 220 can also be connected to each other in a modular integration manner.

In an embodiment, the modular integration manner includes steps described below. The sensor module and the artificial intelligence processing module are configured in respective independent chips, the respective independent chips are connected to each other through a metal wire on a connecting plate, and the metal wire is located in at least one metal layer.

The chip in which the sensor module is configured is integrated with the chip in which the artificial intelligence processing module is configured. It can be understood that chip in which the sensor module is configured and the chip in which the artificial intelligence processing module is configured are integrated into a same module according to a preset distance, and are connected through metal wires of the connecting plate between two chips, and the metal wires may be located in a same metal layer or different metal layers, which is not limited in the embodiment of the present application. The chip in which the sensor module is configured is prepared according to a first preset process parameter, the chip in which the artificial intelligence processing module is configured is prepared according to a second preset process parameter, and the first preset process parameter and the second preset process parameter can be set according to actual conditions. For example, the first preset process parameter may be set to 110 nm, the second preset process parameter may be set to 28 nm, and the second preset process parameter may also be set to 10 nm or less. Preparing the chip in which the sensor module is configured and the chip in which the artificial intelligence processing module is configured through different process parameters can improve cost performance of the entire module, and through the modular integration manner, noise interference between the sensor module and the artificial intelligence processing module can be reduced.

Figure 2B:
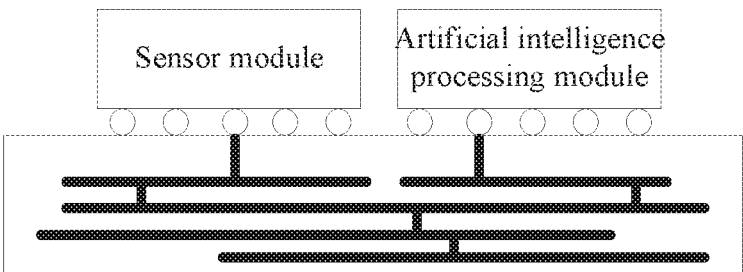
FIG. 2B is a structural diagram of an intelligent sensor modular integration manner in an embodiment.

FIG. 2B is a structural diagram of an intelligent sensor modular integration manner in an embodiment of the present application. Referring to FIG. 2B, that the sensor module and the artificial intelligence processing module are configured in respective independent chips, and the respective independent chips are connected to each other through a metal wire on a connecting plate includes:

the connecting plate includes a carrier plate; and the sensor module and the artificial intelligence processing module are packaged side-by-side on the carrier plate, the sensor module and the artificial intelligence processing module are connected to each other through a metal wire on the carrier plate.

In an embodiment, the carrier plate may include a glass plate, a silicon plate, an organic material plate, a ceramic material plate, a plastic plate or the like. The process of modular integration between the sensor module and the artificial intelligence processing module may include a modular design of the intelligent sensor system architecture and also may include the modularity of the preparation process.

Figure 2C:
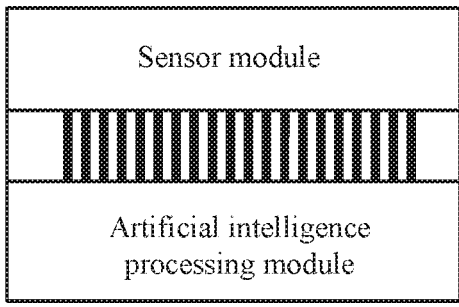
FIG. 2C is a structural diagram of another intelligent sensor modular integration manner in an embodiment.

FIG. 2C is a structural diagram of another intelligent sensor modular integration manner in an embodiment. Referring to FIG. 2C, that the sensor module and the artificial intelligence processing module are configured in respective independent chips, and the respective independent chips are connected to each other through a metal wire on a connecting plate further includes:

the connecting plate includes an adapter plate; and the chip in which the sensor module is configured and the chip in which the artificial intelligence processing module is configured are packaged in a stacked three-dimension manner through the adapter plate, the sensor module and the artificial intelligence processing module are connected to each other through a metal wire on the adapter plate.

In an embodiment, the adapter plate includes a through silicon via (TSV), a through glass via (TGV), a through substrate via (TSV) or the like.

Through packaging the chip in which the sensor module is configured and the chip in which the artificial intelligence processing module is configured in a stacked three-dimension manner, the chip in which the sensor module is configured and the chip in which the artificial intelligence processing module is configured are directly connected, the two chips are connected by a metal through via, and the connection length is reduced to increase the transmission speed of electrical signals, which can reduce power consumption and a module area, thereby saving space of a mainboard.

An implementation manner of the modular integration is not limited to side-by-side packaging and stacked three-dimensional packaging. The implementation manner of the modular integration may be determined according to actual requirements, such as transmission bandwidth requirements, delay requirements, equipment volume requirements, cost performance and the like, which is not limited in this embodiment of the present application.

The intelligent sensor system architecture provided by the embodiment of the present application can reduce the transmission distance between the sensor module and the artificial intelligence processing module, reduce the transmission delay, increase the transmission rate, and improve integration degree between the sensor module and the artificial intelligence processing module, which is conducive to miniaturization of intelligent devices and improve user experiences.

Figure 3:
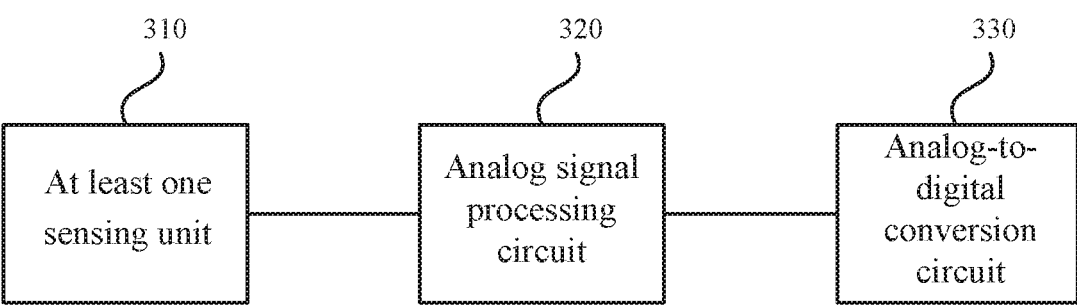
FIG. 3 is a structural diagram of a sensor module in an embodiment.

FIG. 3 is a structural diagram of a sensor module in an embodiment of the present application. This embodiment optimizes the above embodiment, and describes the sensor module. As shown in FIG. 3, the sensor module in this embodiment includes: at least one sensing unit 310, an analog signal processing circuit 320 and an analog-to-digital conversion circuit 330.

The at least one sensing unit 310 is connected to the analog signal processing circuit and is configured to: receive the measurement signal, convert the measurement signal into the electrical signal and transmit the electrical signal to the analog signal processing circuit.

The at least one sensing unit 310 can acquire at least one measurement signal and convert the measurement signal into an electrical signal.

The analog signal processing circuit 320 is connected to the analog-to-digital conversion circuit and is configured to: perform analog signal processing on the electrical signal and transmit an analog processing result to the analog-to-digital conversion circuit.

The analog signal processing circuit 320 can perform analog signal processing on the electrical signal generated and output by at least one sensing unit 310, for example, the analog signal processing may include signal modulation, signal filtering, signal amplification, and performing calculus, power, prescription, division and the like on the signal.

The analog-to-digital conversion circuit 330 is configured to: under control of a clock circuit, convert the analog processing result into a digital signal and output the digital signal.

The analog-to-digital conversion circuit 330 can convert the analog signal into a digital signal through sampling and quantizing the analog signal.

In an embodiment, the sensor module may further include a clock circuit, a control circuit, an interface circuit and the like. In this embodiment, a CMOS image sensor (CIS) is used as an example. The image sensor may include a pixel unit array, analog signal processing circuit, analog-to-digital conversion circuit, sequential logic circuit, control circuit, interface circuit and the like. External light irradiates the pixel unit array to generate a photoelectric effect, corresponding charges are generated in the pixel unit array, that is, the image sensor acquires an optical signal, converts the optical signal into an electrical signal, perform analog signal processing on the electrical signal, under control of a clock circuit, converts an analog processing result into a digital signal and the control circuit controls the digital signal to transmit the digital signal to the artificial intelligence processing module through the interface circuit.

This embodiment provides a sensor module, which can sense measured information, convert the sensed information into an electrical signal or other information output in a required form, meet the requirements of information acquisition, transmission, processing, storage, control and the like, thereby implementing automatic detection and automatic control functions.

Figure 4:
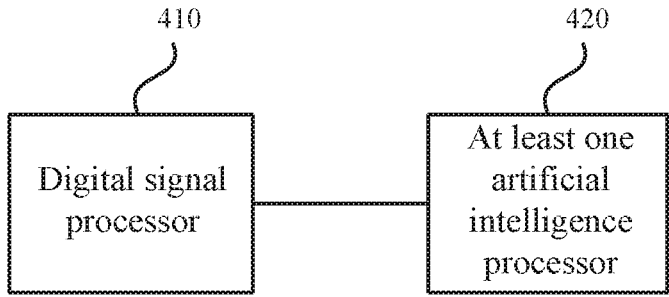
FIG. 4 is a structural diagram of an artificial intelligence processing module in an embodiment.

FIG. 4 is a structural diagram of an artificial intelligence processing module in an embodiment of the present application. The embodiment of the present application optimizes the above embodiment, and describes an artificial intelligence processing module. As shown in FIG. 4, the artificial intelligence processing module in this embodiment includes a digital signal processor 410 and at least one artificial intelligence processor 420;

the digital signal processor 410 is configured to perform digital signal processing and output a digital signal processing result.

The digital signal processor may perform digital signal processing on the electrical signal, for example, at least one of digital filtering, discrete transformation, or spectrum analysis on the electrical signal. Taking the image sensor as an example, the digital signal processor may perform at least one operation of automatic exposure control, non-uniform compensation, white balance processing, gamma correction, or the like on the electrical signal generated by the sensor module.

The at least one artificial intelligence processor 420 is configured to execute a corresponding artificial intelligence processing operation on the electrical signal.

This embodiment provides an artificial intelligence processing module, which can implement various artificial intelligence processing operations, improve system performance, increase the operational capability of the system and further increase the artificial intelligence degree of intelligent device.

Figure 5A:
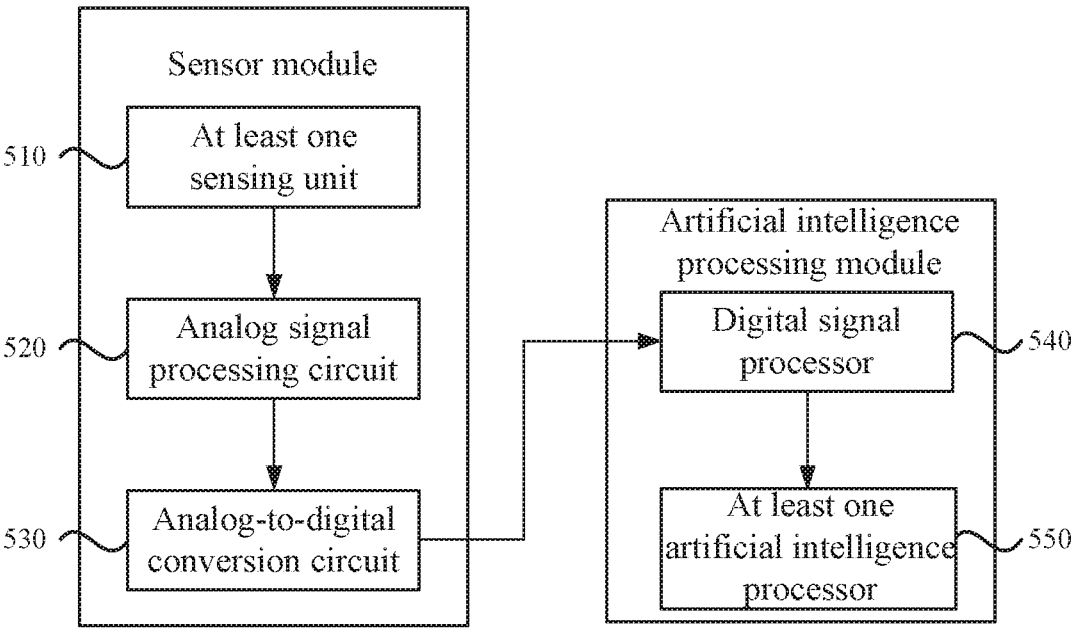
FIG. 5A is a structural diagram of an intelligent sensor system architecture in an embodiment.

FIG. 5A is a structural diagram of an intelligent sensor system architecture in an embodiment of the present application. The embodiment of the present application optimizes the above embodiment, and describes a connection manner of each functional unit of the sensor module and each functional unit of the artificial intelligence processing module. Referring to FIG. 5A, the embodiment of the present application includes:

According to different application scenarios and actual requirements, such as delay requirements, error requirements, and the like, different connection manner can be performed between each functional unit of the sensor module and each functional unit of the artificial intelligence processing module.

In an embodiment, the sensor module includes at least one sensing unit 510, an analog signal processing circuit 520 and an analog-to-digital conversion circuit 530, and the artificial intelligence processing module includes a digital signal processor 540 and at least one artificial intelligence processor 550.

The digital signal processor 540 is connected to an output end of the analog-to-digital conversion circuit 530 in the sensor module and an input end of the artificial intelligence processor.

The digital signal processor 540 is configured to perform digital signal processing according to the electrical signal generated by the sensor module and output a digital signal processing result.

The intelligence processor 550 is configured to execute a corresponding artificial intelligence processing operation according to the digital signal processing result.

The digital signal processor 540 receives an electrical signal output from the analog-to-digital conversion circuit 530 in the sensor module and performs digital signal processing on the electrical signal, and the at least one artificial intelligence processor 550 receives an electrical signal generated by the digital signal processor 540 and performs an artificial intelligence operation on the electrical signal.

Figure 5B:
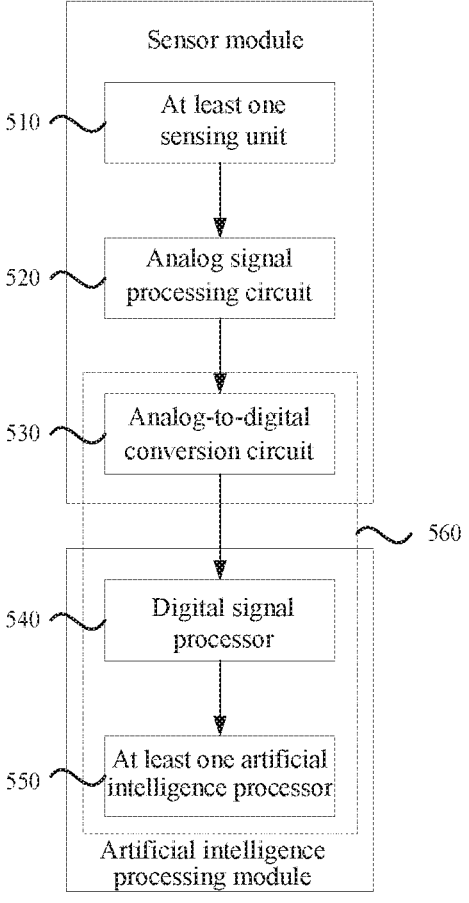
FIG. 5B is a structural diagram of another intelligent sensor system architecture in an embodiment.

FIG. 5B is a structural diagram of another intelligent sensor system architecture in an embodiment of the present application. Referring to FIG. 5B, in an embodiment, the sensor module includes at least one sensing unit 510, an analog signal processing circuit 520 and an analog-to-digital conversion circuit 530, and the artificial intelligence processing module includes a digital signal processor 540 and at least one artificial intelligence processor 550.

The at least one artificial intelligence processor 550, the digital signal processor 540 and the analog-to-digital conversion circuit 530 are directly connected to form an integrated circuit 560 for digital processing and artificial intelligence operation.

The integrated circuit 560 for digital processing and artificial intelligence operation is configured to, according to the analog processing result output by the analog signal processing circuit, perform analog-to-digital conversion and digital signal processing, and execute a corresponding artificial intelligence processing operation.

In an embodiment, the integrated circuit 560 for digital processing and artificial intelligence operation receives the electrical signal generated by the analog signal processing circuit 520 in the sensor module, and performs analog-to-digital conversion, digital signal processing and a corresponding artificial intelligence processing operation on the electrical signal. The integrated circuit 560 for digital processing and artificial intelligence operation is not limited with respect to the order in which the analog-to-digital conversion, the digital signal processing, and corresponding artificial intelligence processing operation are performed. Exemplarily, for the electrical signal generated by the analog signal processing circuit 520, the analog-to-digital conversion and the digital signal processing may be performed while executing the artificial intelligence processing operation. For example, in an application scenario of automatic driving, if an infrared signal is detected within a preset distance in front of a vehicle, an alarm is given and the vehicle is automatically braked. It should be understood by those skilled in the art that the analog-to-digital conversion operation inevitably produces an error. However, in the application scenario of automatic driving, the error may have adverse effects on the alarm or automatic braking, so when the signal reaches the condition of artificial intelligence processing, the artificial intelligence processing operation is executed, and the analog-to-digital conversion and the digital signal processing may be performed simultaneously, and according to the result of the analog-to-digital conversion or the digital signal processing, the artificial intelligence processor 550 may continue to execute the corresponding artificial processing operation, thereby reducing the transmission delay and the error.

This embodiment provides an intelligent sensor system architecture, which can not only implement strong artificial intelligence, but also fully exert the advantage of data processing, improve the intelligent degree of an intelligent sensor system, reduce the transmission delay, improve the transmission rate and the transmission bandwidth, and meet the requirements of specific application scenarios.

Figure 6A:
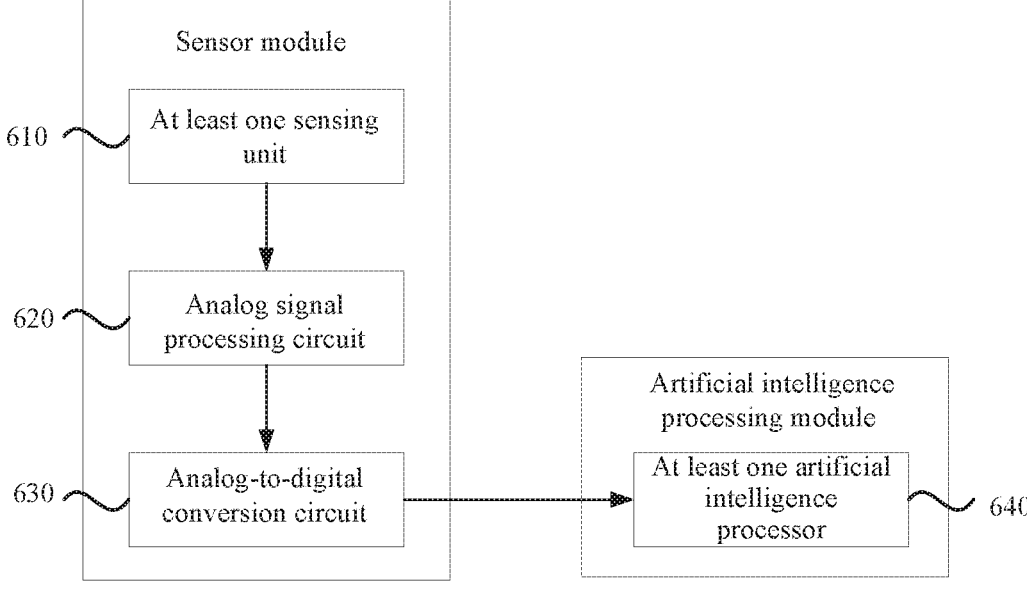
FIG. 6A is a structural diagram of another intelligent sensor system architecture in an embodiment.

FIG. 6A is a structural diagram of another intelligent sensor system architecture in an embodiment of the present application. The embodiment of the present application optimizes the above embodiment, and describes a connection manner of each functional unit of the sensor module and each functional unit of the artificial intelligence processing module. Referring to FIG. 6A, in an embodiment, the sensor module includes at least one sensing unit 610, an analog signal processing circuit 620 and an analog-to-digital conversion circuit 630, and the artificial intelligence processing module includes at least one artificial intelligence processor 640.

An input end of the artificial intelligence processor 640 is connected to the output end of the analog-to-digital conversion circuit 630 in the sensor module.

The artificial intelligence processor 640 is configured to execute a corresponding artificial intelligence processing operation according to the digital signal output by the analog-to-digital conversion circuit in the sensor module.

An electrical signal generated by the analog-to-digital conversion circuit in the sensor module is acquired through at least one artificial intelligence processor, and a corresponding artificial intelligence processing operation is executed on the electrical signal.

Figure 6B:
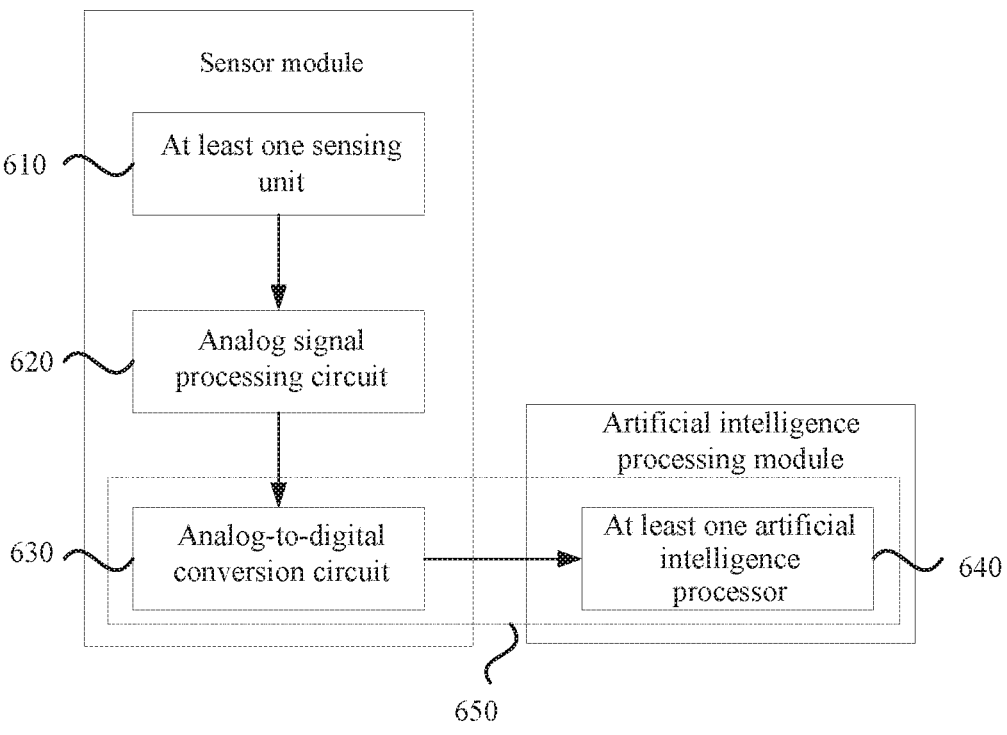
FIG. 6B is a structural diagram of another intelligent sensor system architecture in an embodiment.

FIG. 6B is a structural diagram of another intelligent sensor system architecture in an embodiment of the present application. Referring to FIG. 6B, in an embodiment, the sensor module includes at least one sensing unit 610, an analog signal processing circuit 620 and an analog-to-digital conversion circuit 630, and the artificial intelligence processing module includes at least one artificial intelligence processor 640.

The at least one artificial intelligence processor 640 and the analog-to-digital conversion circuit 630 in the sensor module are directly connected to form an integrated circuit 650 for analog-to-digital conversion and artificial intelligence operation.

The integrated circuit 650 for analog-to-digital conversion and artificial intelligence operation is configured to, according to the analog processing result output by the analog signal processing circuit, perform analog-to-digital conversion and execute a corresponding artificial intelligence processing operation.

The integrated circuit 650 for analog-to-digital conversion and artificial intelligence operation receives an electrical signal generated by the analog signal processing circuit 620 in the sensor module, and performs analog-to-digital conversion and a corresponding artificial intelligence processing operation on the electrical signal. The integrated circuit 650 for analog-to-digital conversion and artificial intelligence operation is not limited with respect to the order in which the analog-to-digital conversion and the corresponding artificial intelligence processing operation are performed. The artificial intelligence processor 640 may also be capable of performing digital signal processing, performing analog-to-digital conversion during the artificial intelligence operation can understood that the artificial intelligence processor 640 may acquires an electrical signal before performing the analog-to-digital conversion operation, an intermediate signal during the analog-to-digital conversion operation, or an electrical signal after performing the analog-to-digital conversion operation.

This embodiment provides an intelligent sensor system architecture, which can not only implement strong artificial intelligence, but also fully exert the advantage of data processing, have a higher intelligent degree, reduce the transmission delay, improve the transmission rate and the transmission bandwidth, meet the requirements of specific application scenarios, and meet the needs of users.

Figure 7:
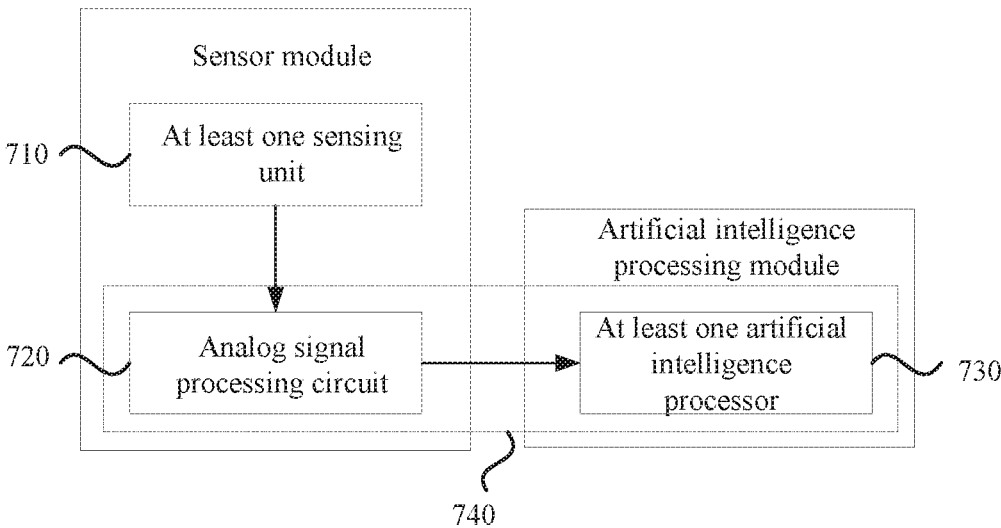
FIG. 7 is a structural diagram of another intelligent sensor system architecture in an embodiment.

FIG. 7 is a structural diagram of another intelligent sensor system architecture in an embodiment of the present application. The embodiment of the present application optimizes the above embodiment, and describes a connection manner of each functional unit of the sensor module and each functional unit of the artificial intelligence processing module. Referring to FIG. 7, the sensor module includes at least one sensing unit 710 and an analog signal processing circuit 720.

The at least one sensing unit 710 is connected to the analog signal processing circuit and is configured to: receive the measurement signal, convert the measurement signal into the electrical signal and transmit the electrical signal to the analog signal processing circuit.

The analog signal processing circuit 720 is configured to perform analog signal processing according to the electrical signal output by the at least one sensing unit.

The artificial intelligence processing module includes at least one artificial intelligence processor 730, the at least one artificial intelligence processor 730 and the analog signal processing circuit 720 in the sensor module are directly connected to form an integrated circuit 740 for analog signal processing and artificial intelligence operation The integrated circuit 740 for analog signal processing and artificial intelligence operation is configured to, according to the electrical signal output by the at least one sensing unit, perform analog signal processing and execute a corresponding artificial intelligence operation.

The integrated circuit 740 for analog signal processing and artificial intelligence operation receives the electrical signal generated by at least one sensing unit in the sensor module, performs analog signal processing on the electrical signal, and executes a corresponding artificial intelligence processing operation. The integrated circuit 740 for analog signal processing and artificial intelligence operation is not limited with respect to the order in which the analog signal processing and a corresponding artificial intelligence processing operation are performed. The artificial intelligence processor 730 may also be capable of performing analog-to-digital conversion and digital signal processing, and performing an analog signal processing operation during the artificial intelligence operation may be understood that the artificial intelligence processor 730 may intervene in an analog signal processing circuit in the sensor module, and the artificial intelligence processor 730 may acquire an electrical signal before performing the analog signal processing operation, an intermediate signal during the analog signal processing operation, or an electrical signal after performing the analog signal processing operation, thereby reducing response delay of the artificial intelligence operation.

The embodiment of the present application provides an intelligent sensor system architecture, which can advance the artificial intelligence operation, and then improve the time of artificial intelligence response, enough implement strong artificial intelligence, also full play the advantage of data processing, have higher intelligent degree, reduce the transmission delay, increase the transmission rate and the transmission bandwidth, and have a wide range application.

Figure 8:
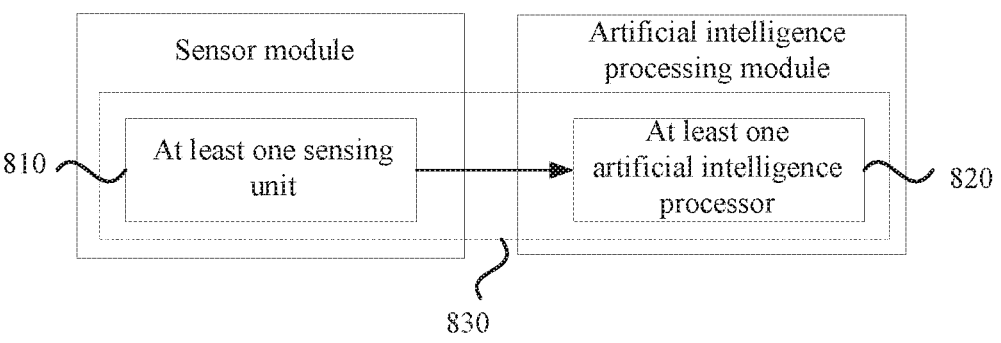
FIG. 8 is a structural diagram of another intelligent sensor system architecture in an embodiment.

FIG. 8 is a structural diagram of another intelligent sensor system architecture in an embodiment of the present application. The embodiment of the present application optimizes the above embodiment, and describes a connection manner of each functional unit of the sensor module and each functional unit of the artificial intelligence processing module. Referring to FIG. 8, In this embodiment, the sensor module includes at least one sensing unit 810.

The at least one sensing unit 810 is configured to receive the measurement signal and convert the measurement signal into the electrical signal.

The artificial intelligence processing module includes at least one artificial intelligence processor 820.

The at least one artificial intelligence processor 820 and the at least one sensing unit 810 in the sensor module are directly connected to form an integrated circuit 830 for sensing and artificial intelligence operation.

The integrated circuit 830 for sensing and artificial intelligence operation is configured to convert the measurement signal into the electrical signal and perform a corresponding artificial intelligence processing operation.

The integrated circuit 830 for sensing and artificial intelligence operation can acquire a measurement signal, and perform a corresponding artificial intelligence operation during converting the measurement signal into an electrical signal, which can be understood that the artificial intelligence processor 820 may intervene in at least one sensing unit in the sensor module, and may directly perform artificial intelligence processing operation on the acquired sensing signal, and the artificial intelligence processor 820 may also be capable of performing analog signal processing, analog-to-digital conversion, and digital signal processing.

This embodiment provides an intelligent sensor system architecture, through performing a corresponding artificial intelligence operation during converting a measurement signal into an electrical signal, delay of performing the artificial intelligence operation, the intelligent degree of the intelligent device is increased, and the safety and reliability of the system are improved.

Figure 9:
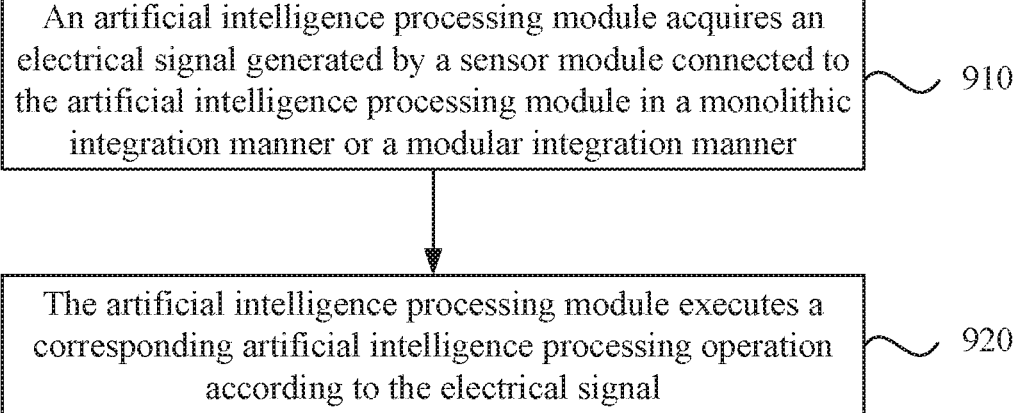
FIG. 9 is a flowchart of a method for implementing an intelligent sensor system architecture in an embodiment.

FIG. 9 is a flowchart of a method for implementing an intelligent sensor system architecture in an embodiment of the present application. This embodiment may be applicable to a case of performing artificial intelligence operation according to the electrical signal generated by the sensor module, and the method may be executed by an apparatus for implementing an intelligent sensor system architecture, which may be implemented in a software and/or hardware manner and is generally integrated in an artificial intelligence processing module, for example, an artificial intelligence processor and the like. The method in the embodiment of the present application includes the steps described below.

In step 910, an artificial intelligence processing module acquires an electrical signal generated by a sensor module connected to the artificial intelligence processing module in a monolithic integration manner or a modular integration manner.

In an embodiment, the step in which the artificial intelligence processing module acquires the electrical signal generated by the sensor module connected to the artificial intelligence processing module in the monolithic integration manner includes steps described below.

The artificial intelligence processing module acquires an electrical signal transmitted by the sensor modular integration in a same chip through a metal wire in the chip.

When the artificial intelligence processing module and the sensor module are connected in the monolithic integration manner, the artificial intelligence processing module receives an electrical signal generated by the sensor module or part of functional units in the sensor module through a metal wire in the chip.

In an embodiment, the step in which the artificial intelligence processing module acquires the electrical signal generated by the sensor module connected to the artificial intelligence processing module in the modular integration manner includes steps described below.

The artificial intelligence processing module acquires the electrical signal transmitted by the sensor module through a metal wire on a connecting plate, where the sensor module and the artificial intelligence processing module are configured in respective independent chips, and the respective independent chips are connected through a metal wire on the connecting plate.

When the artificial intelligence processing module and the sensor module are connected in the modular integration manner, the artificial intelligence processing module receives an electrical signal generated by the sensor module or part of functional units in the sensor module through a metal wire on the connecting plate between two chips.

In step 920, the artificial intelligence processing module executes a corresponding artificial intelligence processing operation according to the electrical signal.

The artificial intelligence processing module may include at least one artificial intelligence processor and a digital signal processor and execute one or more artificial intelligence processing operations, and the at least one artificial intelligence processor can be used for implementing voice recognition, machine vision, face recognition, cognitive behaviors and the like.

In this embodiment, according to different application scenarios and actual requirements, such as delay requirements, error requirements, and the like, different connection manner can be performed between each functional unit of the sensor module and each functional unit of the artificial intelligence processing module.

In an embodiment, the sensor module includes at least one sensing unit, an analog signal processing circuit and an analog-to-digital conversion circuit;

when the artificial intelligence processing module includes at least one first artificial intelligence processor, and the at least one first artificial intelligence processor has an input end connected to an output end of the analog-to-digital conversion circuit, the step in which the artificial intelligence processing module acquires the electrical signal generated by the sensor module connected to the artificial intelligence processing module in the monolithic integration manner or the modular integration manner includes a step described below.

Through the at least one first artificial intelligence processor, an electrical signal generated by the analog-to-digital conversion circuit in the sensor module is acquired.

In an embodiment, the sensor module includes at least one sensing unit, an analog signal processing circuit and an analog-to-digital conversion circuit;

when the artificial intelligence processing module includes at least one second artificial intelligence processor and a first digital signal processor, the first digital signal processor has an input end connected to the output terminal of the analog-to-digital conversion circuit and an output end connected to the at least one second artificial intelligence processor, the step in which the artificial intelligence processing module acquires the electrical signal generated by the sensor module connected to the artificial intelligence processing module in the monolithic integration manner or the modular integration manner includes a step described below.

Through the at least one second artificial intelligence processor, an electrical signal generated by the first digital signal processor is received.

In an embodiment, the sensor module includes at least one sensing unit, an analog signal processing circuit and an analog-to-digital conversion circuit;

when the artificial intelligence processing module includes at least one third artificial intelligence processor, and the at least one third artificial intelligence processor and the analog-to-digital conversion circuit are directly connected to form an integrated circuit for analog-to-digital conversion and artificial intelligence operation, the step in which the artificial intelligence processing module acquires the electrical signal generated by the sensor module connected to the artificial intelligence processing module in the monolithic integration manner or the modular integration manner includes a step described below.

Through the integrated circuit for analog-to-digital conversion and artificial intelligence operation, an electrical signal generated by the analog signal processing circuit is acquired.

The step in which the artificial intelligence processing module executes the corresponding artificial intelligence processing operation according to the electrical signal includes a step described below.

The artificial intelligence processing module performs analog-to-digital conversion and executes a corresponding artificial intelligence processing operation according to the electrical signal generated by the analog signal processing circuit.

In an embodiment, the sensor module includes at least one sensing unit, an analog signal processing circuit and an analog-to-digital conversion circuit;

when the artificial intelligence processing module includes at least one fourth artificial intelligence processor and a second digital signal processor, the at least one fourth artificial intelligence processor, the second digital signal processor and the analog-to-digital conversion circuit are directly connected to form an integrated circuit for digital processing and artificial intelligence operation, the step in which the artificial intelligence processing module acquires the electrical signal generated by the sensor module connected with the artificial intelligence processing module in the monolithic integration manner or the modular integration manner includes a step described below.

Through the integrated circuit for digital processing and artificial intelligence operation, an electrical signal generated by the analog signal processing circuit is acquired.

The step in which the artificial intelligence processing module executes the corresponding artificial intelligence processing operation according to the electrical signal includes a step described below.

The artificial intelligence processing module performs analog-to-digital conversion and digital signal processing, and executes a corresponding artificial intelligence processing operation according to the electrical signal generated by the analog signal processing circuit.

In an embodiment, the sensor module includes at least one sensing unit and an analog signal processing circuit;

when the artificial intelligence processing module includes at least one fifth artificial intelligence processor, the at least one fifth artificial intelligence processor and the analog signal processing circuit are directly connected to form an integrated circuit for analog signal processing and artificial intelligence operation, the step in which the artificial intelligence processing module acquires the electrical signal generated by the sensor module connected to the artificial intelligence processing module in the monolithic integration manner or the modular integration manner includes a step described below.

Through the integrated circuit for analog signal processing and artificial intelligence operation, an electrical signal generated by the at least one sensing unit is acquired.

The step in which the artificial intelligence processing module executes the corresponding artificial intelligence processing operation according to the electrical signal includes a step described below.

The artificial intelligence processing module performs analog signal processing and executes a corresponding artificial intelligence processing operation according to the electrical signal output by the at least one sensing unit.

In an embodiment, the sensor module includes at least one sensing unit;

when the artificial intelligence processing module includes at least one sixth artificial intelligence processor, and the at least one sixth artificial intelligence processor and the at least one sensing unit are connected to form an integrated circuit for sensing and artificial intelligence operation, the step in which the artificial intelligence processing module acquires the electrical signal generated by the sensor module connected to the artificial intelligence processing module in the monolithic integration manner or the modular integration manner includes a step described below.

Through the integrated circuit for sensing and artificial intelligence operation, a measurement signal and converting the measurement signal into an electrical signal is acquired.

The step in which the artificial intelligence processing module executes the corresponding artificial intelligence processing operation according to the electrical signal includes a step described below.

When converting the measurement signal into the electrical signal, the artificial intelligence processing module performs a corresponding artificial intelligence processing operation.

This embodiment provides an method for implement an intelligent sensor system architecture, which can reduce the transmission distance between a sensor module and an artificial intelligence processing module, thereby effectively improving the data transmission rate, reducing the delay of data transmission, quickly performing artificial intelligence operation on a signal generated by the sensor module, improving the degree of artificial intelligence, and having a wide application range and high reliability.

Figure 10:
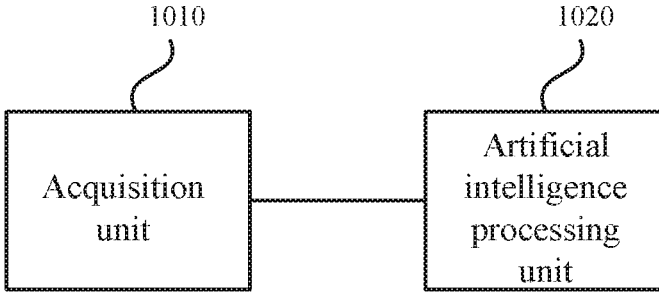
FIG. 10 is a structural diagram of an apparatus for implementing an intelligent sensor system architecture in an embodiment.

FIG. 10 is a structural diagram of an apparatus for implementing an intelligent sensor system architecture in an embodiment of the present application. The apparatus is applicable to a case of executing artificial intelligence operation according to the electrical signal generated by the sensor module, and the apparatus can be implemented in a software and/or hardware manner and is generally integrated in an artificial intelligence processing module, such as an artificial intelligence processor and the like. As shown in FIG. 10, the apparatus includes an acquisition unit 1010 and an artificial intelligence processing unit 1020.

The acquisition unit 1010 is configured in an artificial intelligence processing module and is configured to acquire an electrical signal generated by a sensor module connected to the artificial intelligence processing module in a mono-lithic integration manner or a modular integration manner;

The artificial intelligence processing unit 102 is configured in the artificial intelligence processing module and is configured to perform a corresponding artificial intelligence processing operation according to the electrical signal.

In the embodiments of the present application, the sensor module and the artificial intelligence processing module are connected to each other in a monolithic integration manner or a modular integration manner, a traditional connecting manner in which the sensor module and the artificial intelligence processing module are connected to each other through a data line has been broken through, thereby reducing the transmission distance between sensor module and the artificial intelligence processing module, and then increasing the data transmission rate effectively, reducing delay of data transmission, quickly performing an artificial intelligence operation to the signal generated by the sensor module, improving the artificial intelligence degree, optimizing a design of the system architecture, and having a wide application range.

Based on the embodiment described above, the acquisition unit may include a first acquisition subunit, which is configured to: in a case where the sensor module includes at least one sensing unit, an analog signal processing circuit and an analog-to-digital conversion circuit, the artificial intelligence processing module includes at least one artificial intelligence processor, and the at least one artificial intelligence processor has a input end connected to an output end of the analog-to-digital conversion circuit, acquire an electrical signal generated by the analog-to-digital conversion circuit in the sensor module through at least one artificial intelligence processor;

the artificial intelligence processing unit may include a first artificial intelligence processing subunit, which is configured to execute a corresponding artificial intelligence processing operation according to an electrical signal generated by the analog-to-digital conversion circuit.

Based on the embodiment described above, the acquisition unit may further include a second acquisition subunit, which is configured to: in a case where the sensor module includes at least one sensing unit, an analog signal processing circuit and an analog-to-digital conversion circuit, the artificial intelligence processing module includes at least one artificial intelligence processor and a digital signal processor, the digital signal processor has an input end connected to an output end of the analog-to-digital conversion circuit, and the digital signal processor has an output end connected to the at least one artificial intelligence processor, receive an electrical signal generated by the digital signal processor through the at least one artificial intelligence processor;

the artificial intelligence processing unit may further include a second artificial intelligence processing subunit, which is configured to execute a corresponding artificial intelligence processing operation according to an electrical signal generated by the digital signal processor.

Based on the embodiment described above, the acquisition unit may further include a third acquisition subunit, which is configured to: in a case where the sensor module includes at least one sensing unit, an analog signal processing circuit and an analog-to-digital conversion circuit, the artificial intelligent processing module includes at least one artificial intelligent processor, and the at least one artificial intelligent processor and the analog-to-digital conversion circuit are directly connected to form an integrated circuit for analog-to-digital conversion and artificial intelligence operation, acquire an electrical signal generated by the analog signal processing circuit through the integrated circuit for analog-to-digital conversion and artificial intelligence operation;

the artificial intelligence processing unit may further include a third artificial intelligence processing subunit, which is configured to execute a corresponding artificial intelligence processing operation according to an electrical signal generated by the analog signal processing circuit.

Based on the embodiment described above, the acquisition unit may further include a fourth acquisition subunit, which is configured to: in a case where the sensor module includes at least one sensing unit, an analog signal processing circuit and an analog-to-digital conversion circuit, the artificial intelligence processing module includes at least one artificial intelligence processor and a digital signal processor, and the at least one artificial intelligence processor, the digital signal processor and the analog-to-digital conversion circuit are directly connected to form an integrated circuit for digital processing and artificial intelligence operation, to acquire an electrical signal generated by the analog signal processing circuit through the integrated circuit for digital processing and artificial intelligence operation;

the artificial intelligence processing unit may further include a fourth artificial intelligence processing subunit, which is configured to perform analog-to-digital conversion and digital signal processing and execute a corresponding artificial intelligent processing operation according to the electrical signal generated by the analog signal processing circuit.

Based on the embodiment described above, the acquisition unit may further include a fifth acquisition subunit, which is configured to: in a case where the sensor module includes at least one sensing unit and an analog signal processing circuit, the artificial intelligence processing module includes at least one artificial intelligence processor, and the at least one artificial intelligence processor and the analog signal processing circuit are directly connected to form an integrated circuit for analog signal processing and artificial intelligence operation, acquire the electrical signal generated by the at least one sensing unit through the integrated circuit for analog signal processing and artificial intelligence operation;

the artificial intelligence processing unit may further include a fifth artificial intelligence processing subunit, which is configured to perform analog signal processing and execute corresponding artificial intelligence processing operation according to the electrical signal generated by the at least one sensing unit.

Based on the embodiment described above, the acquisition unit may further include a sixth acquisition subunit, which is configured to: in a case where the sensor module includes at least one sensing unit, the artificial intelligence processing module includes at least one artificial intelligence processor, and the at least one artificial intelligence processor and the at least one sensing unit are directly connected to form an integrated circuit for sensing and artificial intelligence operation, acquire a measurement signal and convert the measurement signal into an electrical signal through the integrated circuit for sensing and artificial intelligence operation;

the artificial intelligence processing unit may further include a sixth artificial intelligence processing subunit, which is configured to execute corresponding artificial intelligence processing operation when converting a measurement signal into an electrical signal.

The apparatus for implementing an intelligent sensor system architecture provided in this embodiment may execute the method for implementing an intelligent sensor system architecture provided in any embodiment of the present application, and has functional modules and beneficial effects corresponding to the method for implementing an intelligent sensor system architecture.

The present application further provides a computer-readable storage medium, which is configured to store computer-executable instructions for executing any one method for implementing an intelligent sensor system architecture described above.

Figure 11:
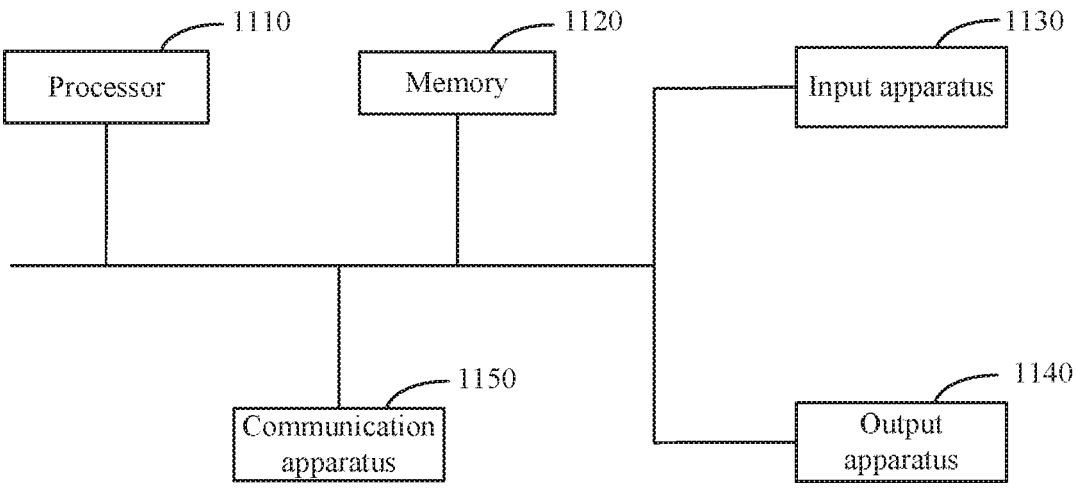
FIG. 11 is a schematic diagram of the hardware structure of an intelligent sensor device in an embodiment.

FIG. 11 is a schematic diagram of the hardware structure of an intelligent sensor device in an embodiment. As shown in FIG. 11, the intelligent sensor device includes: one or more processors 1110 and a memory 1120. FIG. 11 shows one processor 1110 by way of example.

The intelligent sensor device may further include an input apparatus 1130 and an output apparatus 1140.

The processor 1110, the memory 1120, the input apparatus 1130 and the output apparatus 1140 in the intelligent sensor device may be connected via a bus or in other manners, and a connection via a bus is taken as an example in FIG. 11.

The input apparatus 1130 may receive inputted digital or character information and the output apparatus 1140 may include a display device such as a display screen.

As a computer-readable storage medium, the memory 1120 is used for storing software programs and computer-executable programs and modules. The processor 1110 runs the software programs, instructions and modules stored in the memory 1120 to perform function applications and data processing, that is, to implement any one method for implementing an intelligent sensor system architecture in the above-mentioned embodiments.

The memory 1120 may include a program storage region and a data storage region, where the program storage region may store an operating system and an application program required by at least one function; the data storage region may store data created according to use of a intelligent sensor device. In addition, the memory may include a volatile memory, such as a random access memory (RAM), and may also include a nonvolatile memory, such as at least one click memory, a flash memory or other nonvolatile solid-state memories.

The memory 1120 may be a non-transient computer storage medium or a transient computer storage medium. The non-transient computer storage medium includes, for example, at least one disk memory, a flash memory or another nonvolatile solid-state memory. In some embodiments, the memory 1120 includes memories which are remotely disposed relative to the processor 1110 and these remote memories may be connected to the electronic device via a network. Examples of the mention-above network may include the Internet, an intranet, a local area network, a bile communication network, and combinations thereof.

The input apparatus 1130 may be used for receiving inputted digital or character information and for generating key signal input related to user settings and function control of the intelligent sensor device. The output apparatus 1140 may include a display device such as a display screen. The intelligent sensor device in the embodiment may include a communication apparatus 1150 for transmitting and/or receiving information via a communication network.

It will be understood by those of ordinary skill in the art that all or part of the procedure steps in the methods of the above embodiments may be implemented by related hardware executed by one or more computer programs, these programs may be stored in a non-transient computer-readable storage medium, and during the execution of these programs, the procedure steps in the above embodiments may be implemented. The non-transient computer-readable storage medium may be a magnetic disk, an optical disk, a read-only memory (ROM) or a random access memory (RAM).

INDUSTRIAL APPLICABILITY

The present application provides an intelligent sensor system architecture, an implementation method and apparatus thereof, which can improve a data transmission rate, reduce delay of data transmission, quickly execute an artificial intelligence operation on a signal generated by a sensor module, improve an artificial intelligence degree, optimize design of the system architecture and have a wide application range.

What is claimed is:

1. An intelligent sensor system architecture, comprising: a sensor module and an artificial intelligence processing module, wherein the sensor module and the artificial intelligence processing module are connected to each other in a modular integration manner;

the sensor module is configured to acquire a measurement signal and convert the measurement signal into an electrical signal; and the artificial intelligence processing module is configured to execute a corresponding artificial intelligence processing operation according to the electrical signal generated by the sensor module;

wherein the sensor module and the artificial intelligence processing module being connected in the modular integration manner comprises: the sensor module and the artificial intelligence processing module are configured in respective independent chips, the respective independent chips are connected to each other through a metal wire on a connecting plate, and the metal wire is located in at least one metal layer;

wherein when the sensor module and the artificial intelligence processing module are configured in respective independent chips, a chip in which the sensor module is configured is prepared according to a first preset process parameter, and a chip in which the artificial intelligence processing module is configured is prepared according to a second preset process parameter;

wherein the sensor module and the artificial intelligence processing module are configured in respective independent chips, and the respective independent chips are connected to each other through a metal wire on a connecting plate, comprises:

the connecting plate comprises an adapter plate; and the chip in which the sensor module is configured and the chip in which the artificial intelligence processing module is configured are packaged in a stacked three-dimension manner through the adapter plate, the sensor module and the artificial intelligence processing module are connected to each other through a metal wire on the adapter plate, wherein the adapter plate comprises a through silicon via, a through glass via, or a through substrate via.

2. The system architecture of claim 1, wherein that the sensor module and the artificial intelligence processing module are configured in respective independent chips, and the respective independent chips are connected to each other through a metal wire on a connecting plate comprises:

the connecting plate comprises a carrier plate; and the sensor module and the artificial intelligence processing module are packaged side-by-side on the carrier plate, the sensor module and the artificial intelligence processing module are connected to each other through a metal wire on the carrier plate.

3. The system architecture of claim 1, wherein the sensor module comprises at least one sensing unit, an analog signal processing circuit and an analog-to-digital conversion circuit;

the at least one sensing unit is connected to the analog signal processing circuit and is configured to: receive the measurement signal, convert the measurement signal into the electrical signal and transmit the electrical signal to the analog signal processing circuit;

the analog signal processing circuit is connected to the analog-to-digital conversion circuit and is configured to: perform analog signal processing on the electrical signal and transmit an analog processing result to the analog-to-digital conversion circuit; and the analog-to-digital conversion circuit is configured to: under control of a clock circuit, convert the analog processing result into a digital signal and output the digital signal.

4. The system architecture of claim 3, wherein the artificial intelligence processing module comprises at least one artificial intelligence processor, the at least one artificial intelligence processor has an input end connected to an output end of the analog-to-digital conversion circuit in the sensor module;

wherein the at least one artificial intelligence processor is configured to execute a corresponding artificial intelligence processing operation according to the digital signal output by the analog-to-digital conversion circuit in the sensor module.

5. The system architecture of claim 3, wherein the artificial intelligence processing module comprises a digital signal processor and at least one artificial intelligence processor, the digital signal processor is connected to an output end of the analog-to-digital conversion circuit in the sensor module and an input end of the at least one artificial intelligence processor, the digital signal processor is configured to perform digital signal processing according to the electrical signal generated by the sensor module and output a digital signal processing result, and the at least one artificial intelligence processor is configured to execute a corresponding artificial intelligence processing operation according to the digital signal processing result.

6. The system architecture of claim 3, wherein the artificial intelligence processing module comprises at least one artificial intelligence processor, the at least one artificial intelligence processor and the analog-to-digital conversion circuit in the sensor module are directly connected to form an integrated circuit for analog-to-digital conversion and artificial intelligence operation, and the integrated circuit for analog-to-digital conversion and artificial intelligence operation is configured to, according to the analog processing result output by the analog signal processing circuit, perform analog-to-digital conversion and execute a corresponding artificial intelligence processing operation.

7. The system architecture of claim 3, wherein the artificial intelligence processing module comprises a digital signal processor and at least one artificial intelligence processor, the at least one artificial intelligence processor, the digital signal processor and the analog-to-digital conversion circuit are directly connected to form an integrated circuit for digital processing and artificial intelligence operation, and the integrated circuit for digital processing and artificial intelligence operation is configured to, according to the analog processing result output by the analog signal processing circuit, perform analog-to-digital conversion and digital signal processing, and execute a corresponding artificial intelligence processing operation.

8. The system architecture of claim 1, wherein the sensor module comprises at least one sensing unit and an analog signal processing circuit;

the at least one sensing unit is connected to the analog signal processing circuit and is configured to: receive the measurement signal, convert the measurement signal into the electrical signal and transmit the electrical signal to the analog signal processing circuit; and the analog signal processing circuit is configured to perform analog signal processing according to the electrical signal output by the at least one sensing unit, wherein the artificial intelligence processing module comprises at least one artificial intelligence processor, the at least one artificial intelligence processor and the analog signal processing circuit in the sensor module are directly connected to form an integrated circuit for analog signal processing and artificial intelligence operation, and the integrated circuit for analog signal processing and artificial intelligence operation is configured to, according to the electrical signal output by the at least one sensing unit, perform analog signal processing and execute a corresponding artificial intelligence operation.

9. The system architecture of claim 1, wherein the sensor module comprises at least one sensing unit, and the at least one sensing unit is configured to receive the measurement signal and convert the measurement signal into the electrical signal, wherein the artificial intelligence processing module comprises at least one artificial intelligence processor, the at least one artificial intelligence processor and the at least one sensing unit in the sensor module are directly connected to form an integrated circuit for sensing and artificial intelligence operation, the integrated circuit for sensing and artificial intelligence operation is configured to convert the measurement signal into the electrical signal and perform a corresponding artificial intelligence processing operation.

10. A method for implementing an intelligent sensor system architecture, comprising:

acquiring, by an artificial intelligence processing module, an electrical signal generated by a sensor module connected to the artificial intelligence processing module in a modular integration manner; and executing, by the artificial intelligence processing module, a corresponding artificial intelligence processing operation according to the electrical signal;

wherein acquiring, by the artificial intelligence processing module, the electrical signal generated by the sensor module connected to the artificial intelligence processing module in the modular integration manner comprises: acquiring, by the artificial intelligence processing module, the electrical signal transmitted by the sensor module through a metal wire on a connecting plate, wherein the sensor module and the artificial intelligence processing module are configured in respective independent chips, and the respective independent chips are connected through a metal wire on the connecting plate;

wherein when the sensor module and the artificial intelligence processing module are configured in respective independent chips, a chip in which the sensor module is configured is prepared according to a first preset process parameter, and a chip in which the artificial intelligence processing module is configured is prepared according to a second preset process parameter;

wherein the sensor module and the artificial intelligence processing module are configured in respective independent chips, and the respective independent chips are connected to each other through a metal wire on a connecting plate, comprises:

the connecting plate comprises an adapter plate; and the chip in which the sensor module is configured and the chip in which the artificial intelligence processing module is configured are packaged in a stacked three-dimension manner through the adapter plate, the sensor module and the artificial intelligence processing module are connected to each other through a metal wire on the adapter plate, wherein the adapter plate comprises a through silicon via, a through glass via, or a through substrate via.

11. The method of claim 10, wherein the sensor module comprises at least one sensing unit, an analog signal processing circuit and an analog-to-digital conversion circuit;

wherein when the artificial intelligence processing module comprises at least one first artificial intelligence processor, and the at least one first artificial intelligence processor has an input end connected to an output end of the analog-to-digital conversion circuit, acquiring, by the artificial intelligence processing module, the electrical signal generated by the sensor module connected to the artificial intelligence processing module in the modular integration manner comprises:

acquiring, through the at least one first artificial intelligence processor, an electrical signal generated by the analog-to-digital conversion circuit in the sensor module;

wherein when the artificial intelligence processing module comprises at least one second artificial intelligence processor and a first digital signal processor, the first digital signal processor has an input end connected to the output terminal of the analog-to-digital conversion circuit and an output end connected to the at least one second artificial intelligence processor, acquiring, by the artificial intelligence processing module, the electrical signal generated by the sensor module connected to the artificial intelligence processing module in the modular integration manner comprises:

receiving, through the at least one second artificial intelligence processor, an electrical signal generated by the first digital signal processor;

wherein when the artificial intelligence processing module comprises at least one third artificial intelligence processor, and the at least one third artificial intelligence processor and the analog-to-digital conversion circuit are directly connected to form an integrated circuit for analog-to-digital conversion and artificial intelligence operation, acquiring, by the artificial intelligence processing module, the electrical signal generated by the sensor module connected to the artificial intelligence processing module in the modular integration manner comprises:

acquiring, through the integrated circuit for analog-to-digital conversion and artificial intelligence operation, an electrical signal generated by the analog signal processing circuit;

wherein executing, by the artificial intelligence processing module, the corresponding artificial intelligence processing operation according to the electrical signal comprises:

performing, by the artificial intelligence processing module, analog-to-digital conversion and executing a corresponding artificial intelligence processing operation according to the electrical signal generated by the analog signal processing circuit;

wherein when the artificial intelligence processing module comprises at least one fourth artificial intelligence processor and a second digital signal processor, the at least one fourth artificial intelligence processor, the second digital signal processor and the analog-to-digital conversion circuit are directly connected to form an integrated circuit for digital processing and artificial intelligence operation, acquiring, by the artificial intelligence processing module, the electrical signal generated by the sensor module connected with the artificial intelligence processing module in the modular integration manner comprises:

acquiring, through the integrated circuit for digital processing and artificial intelligence operation, an electrical signal generated by the analog signal processing circuit; and wherein executing, by the artificial intelligence processing module, the corresponding artificial intelligence processing operation according to the electrical signal comprises:

performing, by the artificial intelligence processing module, analog-to-digital conversion and digital signal processing, and executing a corresponding artificial intelligence processing operation according to the electrical signal generated by the analog signal processing circuit.

12. The method of claim 10, wherein the sensor module comprises at least one sensing unit and an analog signal processing circuit;

wherein when the artificial intelligence processing module comprises at least one fifth artificial intelligence processor, the at least one fifth artificial intelligence processor and the analog signal processing circuit are directly connected to form an integrated circuit for analog signal processing and artificial intelligence operation, acquiring, by the artificial intelligence processing module, the electrical signal generated by the sensor module connected to the artificial intelligence processing module in the modular integration manner comprises:

acquiring, through the integrated circuit for analog signal processing and artificial intelligence operation, an electrical signal generated by the at least one sensing unit; and wherein executing, by the artificial intelligence processing module, the corresponding artificial intelligence processing operation according to the electrical signal comprises:

performing, by the artificial intelligence processing module, analog signal processing and executing a corresponding artificial intelligence processing operation according to the electrical signal output by the at least one sensing unit.

13. A non-transitory computer-readable storage medium, which is configured to store computer-executable instructions for executing the method of claim 10.

* * * * *